(12) United States Patent
Yao et al.

(10) Patent No.: US 10,795,228 B2
(45) Date of Patent: Oct. 6, 2020

(54) ARRAY SUBSTRATE WITH DIFFUSE REFLECTION LAYER, METHOD FOR MANUFACTURING THE SAME, AND DISPLAY DEVICE COMPRISING THE SAME

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Lei Yao, Beijing (CN); Dawei Shi, Beijing (CN); Wentao Wang, Beijing (CN); Lu Yang, Beijing (CN); Haifeng Xu, Beijing (CN); Lei Yan, Beijing (CN); Jinfeng Wang, Beijing (CN); Xiaowen Si, Beijing (CN); Fang Yan, Beijing (CN); Jinjin Xue, Beijing (CN); Lin Hou, Beijing (CN); Yuanbo Li, Beijing (CN); Zhixuan Guo, Beijing (CN); Xiaofang Li, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 64 days.

(21) Appl. No.: 16/121,968

(22) Filed: Sep. 5, 2018

(65) Prior Publication Data
US 2019/0072829 A1  Mar. 7, 2019

(30) Foreign Application Priority Data

Sep. 6, 2017 (CN) .......................... 2017 1 0795480

(51) Int. Cl.
*H01L 29/786* (2006.01)
*H01L 51/52* (2006.01)
(Continued)

(52) U.S. Cl.
CPC ...... *G02F 1/136209* (2013.01); *G02F 1/1368* (2013.01); *G02F 1/133553* (2013.01); *G02F 1/136286* (2013.01); *H01L 21/0274* (2013.01); *H01L 27/124* (2013.01); *H01L 27/1218* (2013.01); *H01L 27/1262* (2013.01);
(Continued)

(58) Field of Classification Search
CPC combination set(s) only.
See application file for complete search history.

(56) References Cited

U.S. PATENT DOCUMENTS 6,297,862 B1 * 10/2001 Murade ............. G02F 1/136209
349/44
2005/0128403 A1 * 6/2005 Liu ................... G02F 1/134363
349/141
(Continued)

*Primary Examiner* — Nduka E Ojeh
(74) *Attorney, Agent, or Firm* — Brooks Kushman P.C.

(57) ABSTRACT

The present disclosure provides an array substrate, a method for manufacturing the same, and a display device. The array substrate includes a base substrate, and gate lines and data lines arranged on the base substrate to define a plurality of pixel regions, and a diffuse reflection layer arranged in the plurality of pixel regions, in which a surface of the diffuse reflection layer facing a light emitting side of the array substrate is uneven.

20 Claims, 5 Drawing Sheets

(51) Int. Cl.
*H01L 21/027* (2006.01)
*H01L 27/12* (2006.01)
*H01L 27/32* (2006.01)
*H01L 51/56* (2006.01)
*H01L 21/3213* (2006.01)
*H01L 29/66* (2006.01)
*G02F 1/1362* (2006.01)
*G02F 1/1335* (2006.01)
*G02F 1/1368* (2006.01)

(52) U.S. Cl.
CPC ...... *H01L 27/1288* (2013.01); *H01L 27/3262* (2013.01); *H01L 27/3272* (2013.01); *H01L 29/78633* (2013.01); *H01L 29/78645* (2013.01); *H01L 51/5271* (2013.01); *H01L 51/5281* (2013.01); *H01L 51/56* (2013.01); *G02F 2001/13685* (2013.01); *G02F 2001/136295* (2013.01); *G02F 2202/104* (2013.01); *H01L 21/32134* (2013.01); *H01L 21/32139* (2013.01); *H01L 27/3276* (2013.01); *H01L 29/66757* (2013.01); *H01L 29/78675* (2013.01); *H01L 2227/323* (2013.01)

(56) References Cited

U.S. PATENT DOCUMENTS

| | | | |
|---|---|---|---|
| 2012/0212687 A1* | 8/2012 | Uchida | H01L 27/1214 349/43 |
| 2014/0162407 A1* | 6/2014 | Zwenger | H01L 23/3114 438/113 |
| 2016/0380239 A1* | 12/2016 | Xu | H01L 51/5281 257/40 |

* cited by examiner

ARRAY SUBSTRATE WITH DIFFUSE REFLECTION LAYER, METHOD FOR MANUFACTURING THE SAME, AND DISPLAY DEVICE COMPRISING THE SAME

CROSS-REFERENCE TO RELATED APPLICATION

This application claims priority to Chinese Patent Application No. 201710795480.9 filed on Sep. 6, 2017, which is incorporated herein by reference in its entirety.

TECHNICAL FIELD

The present disclosure relates to the field of display technology, in particular to an array substrate, a method for manufacturing the same, and a display device.

BACKGROUND

Thin film transistor liquid crystal display devices (TFT-LCD) in the related art, in particular portable display devices, have certain limitations in their display under strong outdoor illumination. Due to the strong external light, the intensity of outdoor light is often greater than that of indoor light, leading to a difficulty in recognizing the display content. Usually, in order to improve the display effect at that circumstance, it is necessary to increase the brightness of backlight to maintain a normal display content, however, this not only accelerates the consumption of the battery energy, but also shortens the standby time of the display device, and causes an additional damage to human eyes.

SUMMARY

The present disclosure provides an array substrate, which includes a base substrate, and gate lines and data lines arranged on the base substrate to define a plurality of pixel regions, and a diffuse reflection layer arranged in the plurality of pixel regions, in which a surface of the diffuse reflection layer facing a light emitting side of the array substrate is uneven.

Optionally, the array substrate further includes a light shielding layer for sheltering a thin film transistor of the array substrate from backlight.

Optionally, the diffuse reflection layer and the light shielding layer are arranged on a same layer and made of a same material.

Optionally, an orthogonal projection of the diffuse reflection layer onto the base substrate at least partially overlaps an orthogonal projection of a corresponding one of the plurality of pixel regions onto the base substrate.

Optionally, the array substrate further includes an insulating layer arranged on the base substrate, in which the insulating layer is arranged on a side of the diffuse reflection layer proximate to the base substrate, and a surface of the insulating layer facing a side of the diffuse reflection layer is uneven.

Optionally, a material of the diffuse reflection layer includes at least one of Ag, Au, Mo, Al, and Cu.

Optionally, the diffuse reflection layer includes at least one of a plate-type structure, a strip-type structure, and a block-type structure including blocks arranged in a matrix form.

Optionally, the array substrate is an array substrate of a liquid crystal display device.

The present disclosure further provides a method for manufacturing the array substrate as described above, which includes a step of:

forming the diffuse reflection layer in the plurality of pixel regions, in which the surface of the diffuse reflection layer facing the light emitting side of the array substrate is uneven.

Optionally, the step of forming the diffuse reflection layer in the plurality of pixel regions includes steps of:

forming a metal film layer;

forming a photoresist layer on the metal film layer;

exposing and developing the photoresist layer, to form a photoresist layer pattern, in which the photoresist layer pattern includes at least a first pattern region corresponding to a region where the diffuse reflection layer is arranged;

removing the metal film layer not covered by the photoresist layer pattern, to form a metal film layer pattern;

bombarding the photoresist layer pattern through a plasma process to ash the photoresist layer pattern, and continuing to bombard the metal film layer pattern so as to provide the metal film layer pattern with an uneven surface, in which the metal film layer pattern includes a pattern of the diffuse reflection layer; and stripping off the remaining photoresist layer.

Optionally, prior to the step of forming the diffuse reflection layer in the plurality of pixel regions, the method further includes steps of:

forming an insulating layer; and bombarding the insulating layer through a plasma process, to form an insulating layer having an uneven surface;

and the step of forming the diffuse reflection layer in the plurality of pixel regions includes:

forming a metal film layer;

forming a photoresist layer on the metal film layer;

exposing and developing the photoresist layer, to form a photoresist layer pattern, in which the photoresist layer pattern includes at least a first pattern region corresponding to a region where the diffuse reflection layer is arranged;

removing the metal film layer not covered by the photoresist layer pattern, to form a metal film layer pattern having an uneven surface, in which the metal film layer pattern includes a pattern of the diffuse reflection layer; and stripping off the remaining photoresist layer.

Optionally, the plasma process is a plasma descum process.

Optionally, the photoresist layer pattern further includes a second pattern region corresponding to a region where a light shielding layer for sheltering a thin film transistor of the array substrate from backlight is arranged, and the formed metal film layer pattern further includes a pattern of the light shielding layer.

Optionally, an orthogonal projection of the diffuse reflection layer onto the base substrate at least partially overlaps an orthogonal projection of a corresponding one of the plurality of pixel regions onto the base substrate.

Optionally, a material of the metal film layer includes at least one of Ag, Au, Mo, Al, and Cu.

The present disclosure further provides a display device, which includes the array substrate as described above.

BRIEF DESCRIPTION OF THE DRAWINGS

In order to illustrate the technical solutions of the present disclosure in a clearer manner, the drawings desired for describing the embodiments of the present disclosure will be described briefly hereinafter. Obviously, the following drawings merely relate to some embodiments of the present disclosure. Based on these drawings, a person skilled in the art may obtain the other drawings without any creative effort.

DETAILED DESCRIPTION

In order to illustrate the purposes, technical solution and advantages in the embodiments of the present disclosure in a clearer manner, the technical solutions in the embodiments of the present disclosure will be described hereinafter in conjunction with the drawings of the embodiments of the present disclosure in a clear and complete manner. Obviously, the following embodiments relate to a part of, rather than all of, the embodiments of the present disclosure. Based on the described embodiments of the present disclosure, a person skilled in the art may obtain other embodiments, which also fall within the scope of the present disclosure.

The embodiments of present disclosure provide an array substrate, which includes a base substrate, and gate lines and data lines arranged on the base substrate to define a plurality of pixel regions, and a diffuse reflection layer arranged in the plurality of pixel regions, in which a surface of the diffuse reflection layer facing a light emitting side of the array substrate is uneven.

In the embodiments of the present disclosure, since the diffuse reflection layer having uneven surface is arranged in the pixel region of the array substrate, it is capable of diffusely reflecting external light, and thus capable of improving the brightness of the display device having the array substrate in an outdoor environment, and improving the display effect in the outdoor environment. Further, since the brightness of the display device is increased by the external light, the energy consumption of the display device is not increased.

The diffuse reflection layer in the embodiments of the present disclosure may be made of a metal material having a high reflection coefficient. For example, the material of the diffuse reflection layer may include at least one of Ag, Au, Mo, Al, and Cu, but the diffuse reflection layer may also be made of other materials.

The array substrate in the embodiments of the present disclosure may be an array substrate for a liquid crystal display device or an array substrate for an organic light emitting diode (OLED) display device.

When the array substrate in the embodiment of the present disclosure is an array substrate for a liquid crystal display device, since the backlight needs to pass through the pixel regions, an orthogonal projection of the diffuse reflection layer onto the base substrate partially overlaps an orthogonal projection of a corresponding one of the plurality of pixel regions onto the base substrate. That is, in the pixel regions, the diffuse reflection layer may only occupy a partial region of the corresponding pixel region, and may not occupy the entire region of the corresponding pixel region, so that the backlight may pass through.

Figure 1:
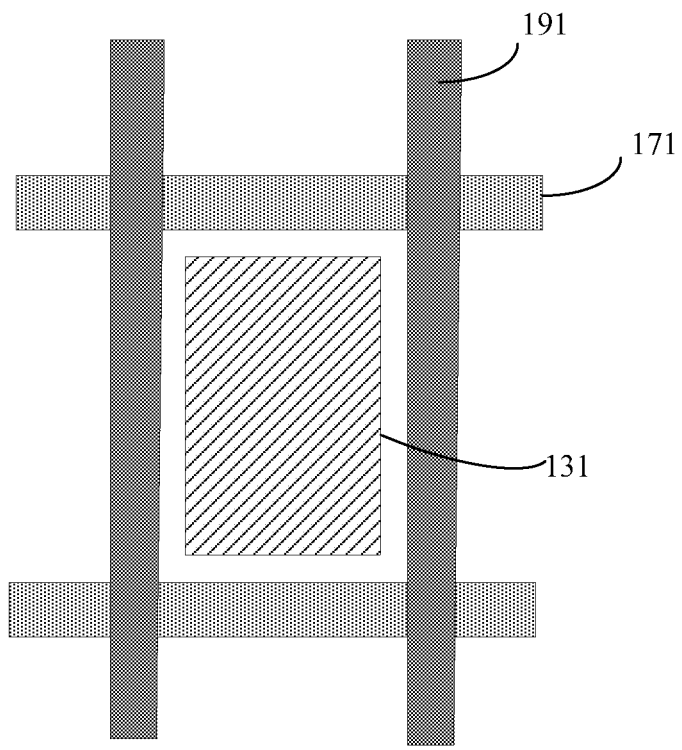
FIG. 1 is a schematic top view of an array substrate according to one embodiment of the present disclosure.

Referring to FIG. 1, FIG. 1 is a schematic top view of an array substrate according to one embodiment of the present disclosure. In the embodiments of present disclosure, an array substrate includes a base substrate (not shown), and gate lines 171 and data lines 191 arranged on the base substrate to define a plurality of pixel regions, and a diffuse reflection layer 131 arranged in the plurality of pixel regions, in which a surface of the diffuse reflection layer 131 facing a light emitting side of the array substrate is uneven. In the embodiment of the present disclosure, the diffuse reflection layer 131 is of an one-piece plate-type structure, and an orthogonal projection of the diffuse reflection layer 131 onto the base substrate partially overlaps an orthogonal projection of a corresponding one of the plurality of pixel regions onto the base substrate, that is, the diffuse reflection layer 131 merely occupies a partial region of the pixel region. Thus, when the array substrate in the embodiment of the present disclosure is an array substrate for a liquid crystal display device, the backlight may pass through the gap between the diffuse reflection layer 131 and the gate line 171 as well as the gap between the diffuse reflection layer 131 and the data line 191. The diffuse reflection layer 131 in the embodiment of the present disclosure may be of a rectangular plate-type structure. Of course, in some other embodiments of the present disclosure, the diffuse reflection layer may also be of other types of arrangement, such as a square or a circle plate-type structure.

Figure 2:
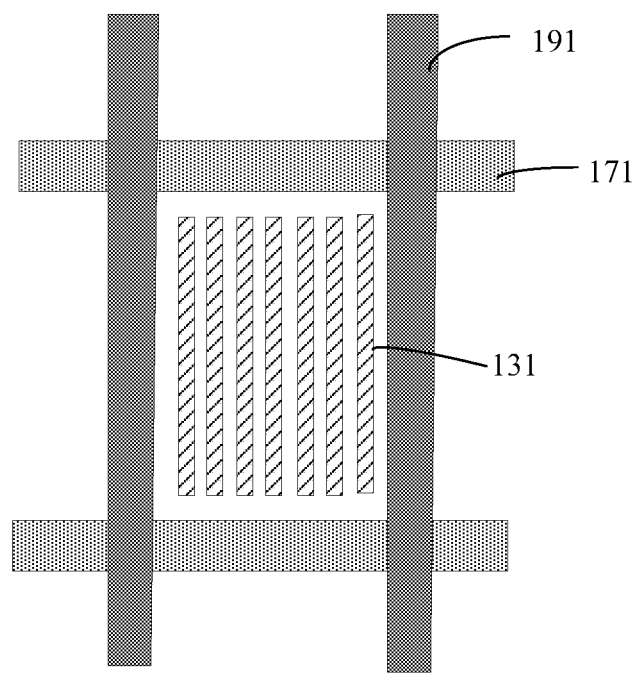
FIG. 2 is a schematic top view of an array substrate according to another embodiment of the present disclosure.

Referring to FIG. 2, FIG. 2 is a schematic top view of an array substrate according to another embodiment of the present disclosure. In the embodiments of present disclosure, an array substrate includes a base substrate (not shown), and gate lines 171 and data lines 191 arranged on the base substrate to define a plurality of pixel regions, and a diffuse reflection layer 131 arranged in the plurality of pixel regions, in which a surface of the diffuse reflection layer 131 facing a light emitting side of the array substrate is uneven. In the embodiment of the present disclosure, the diffuse reflection layer 131 is of a strip-type structure including a plurality of parallel strip-type patterns, and an orthogonal projection of the diffuse reflection layer 131 onto the base substrate partially overlaps an orthogonal projection of a corresponding one of the plurality of pixel regions onto the base substrate, that is, the diffuse reflection layer 131 merely occupies a partial region of the pixel region. Thus, when the array substrate in the embodiment of the present disclosure is an array substrate for a liquid crystal display device, the backlight may pass through the gap between the strip-type pattern and the gate line 171 as well as the gap between the strip-type pattern and the data line 191, and the gap between the plurality of strip-type patterns. In the embodiment of the present disclosure, the diffuse reflection layer 131 in one pixel region may include seven strip-type patterns arranged in parallel. Of course, the number of strip-type patterns is not limited thereto. In addition to the parallel arrangement, the strip-type patterns may be of other arrangements, such as a vertically and horizontally interlaced network structure.

Figure 3:
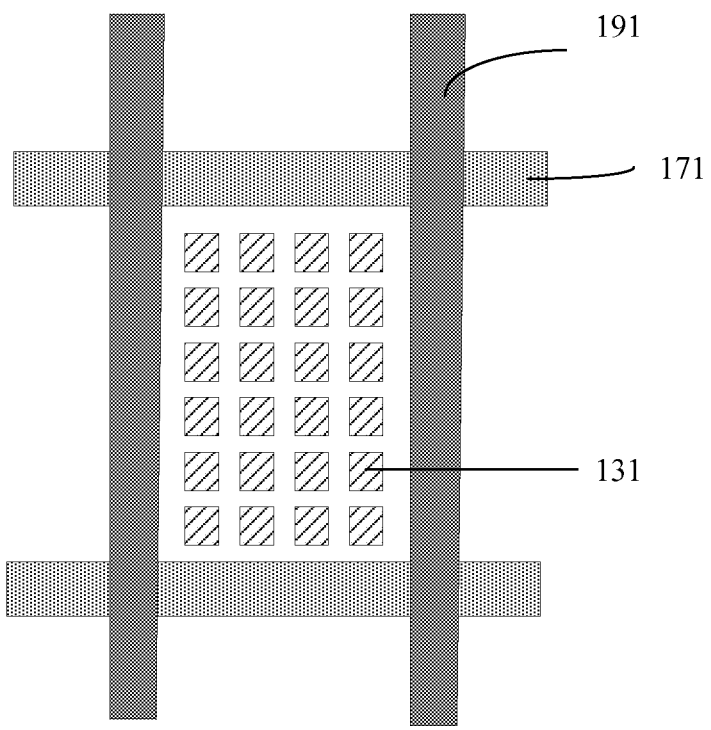
FIG. 3 is a schematic top view of an array substrate according to another embodiment of the present disclosure.

Referring to FIG. 3, FIG. 3 is a schematic top view of an array substrate according to another embodiment of the present disclosure. In the embodiments of present disclosure, an array substrate includes a base substrate (not shown), and gate lines 171 and data lines 191 arranged on the base substrate to define a plurality of pixel regions, and a diffuse reflection layer 131 arranged in the plurality of pixel regions, in which a surface of the diffuse reflection layer 131 facing a light emitting side of the array substrate is uneven. In the embodiment of the present disclosure, the diffuse reflection layer 131 includes a block-type structure which includes a plurality of block-type patterns arranged in a matrix form, and an orthogonal projection of the diffuse reflection layer 131 onto the base substrate partially overlaps an orthogonal projection of a corresponding one of the plurality of pixel regions onto the base substrate, that is, the diffuse reflection layer 131 merely occupies a partial region of the pixel region. Thus, when the array substrate in the embodiment of the present disclosure is an array substrate for a liquid crystal display device, the backlight may pass through the gap between the block-type pattern and the gate line 171 as well as the gap between the block-type pattern and the data line 191, and the gap between the plurality of block-type patterns. The diffuse reflection layer 131 in one pixel region in the embodiment of the present disclosure is of a matrix structure of six rows and four columns. Of course, the number of rows and columns of the matrix structure is not limited thereto, and may also be other values.

In addition, the structure of the diffuse reflection layer is not limited to the above arrangement, and the actual shape and size thereof may be adjusted according to the design requirements on the aperture ratio of the display device.

Figure 4:
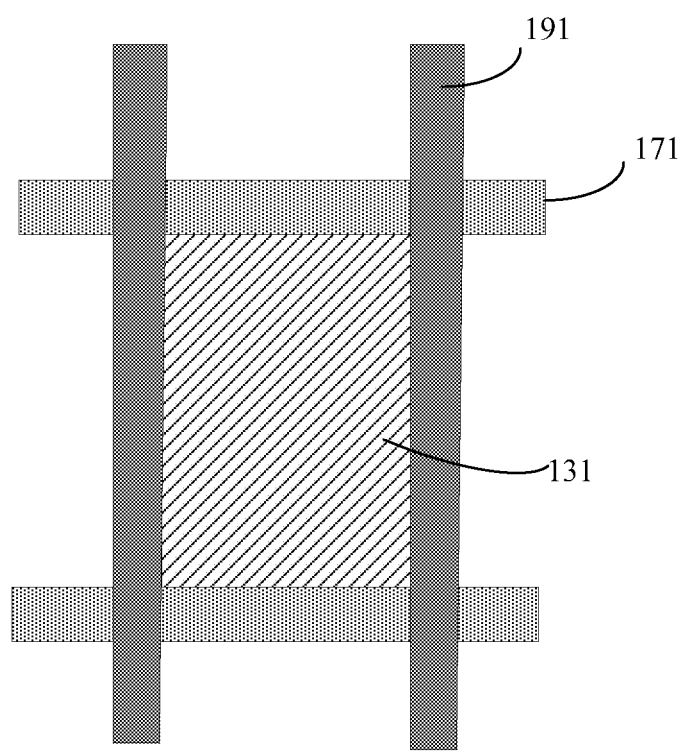
FIG. 4 is a schematic top view of an array substrate according to another embodiment of the present disclosure.

When the array substrate in the embodiment of the present disclosure is an array substrate for OLED, since the backlight does not need to pass through the pixel region, an orthogonal projection of the diffuse reflection layer onto the base substrate may completely overlap an orthogonal projection of a corresponding one of the plurality of pixel regions onto the base substrate. That is, the diffuse reflection layer 131 may occupy the entire region of the corresponding pixel region, referring to FIG. 4. Of course, the diffuse reflection layer may also only occupy a partial region of the corresponding pixel region, referring to FIGS. 1, 2 and 3. That is, the diffuse reflection layer in FIGS. 1, 2 and 3 may be used in an array substrate of liquid crystal-type, and may also be used in an array substrate of OLED-type.

When the array substrate in the embodiment of the present disclosure is an array substrate for a liquid crystal display device, in order to prevent the channel region of the thin film transistor on the array substrate from being illuminated by the backlight and prevent the performance of the thin film transistor from being adversely affected, a light shielding layer for sheltering the thin film transistor from backlight may be generally arranged between the thin film transistor and the base substrate of the array substrate. In the embodiment of the present disclosure, for example, the diffuse reflection layer and the light shielding layer may be arranged on a same layer and made of a same material, so that the diffuse reflection layer and the light shielding layer may be formed through one patterning process, thereby reducing the number of masks used and the manufacturing cost. At the same time, the thickness of the array substrate may also be reduced.

Figure 5:
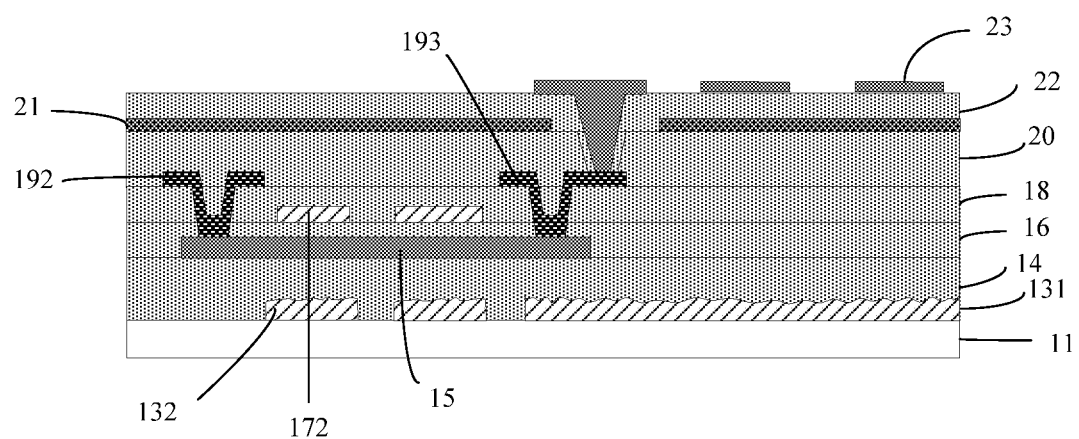
FIG. 5 is schematic sectional view of an array substrate according to another embodiment of the present disclosure.
Figure 6:
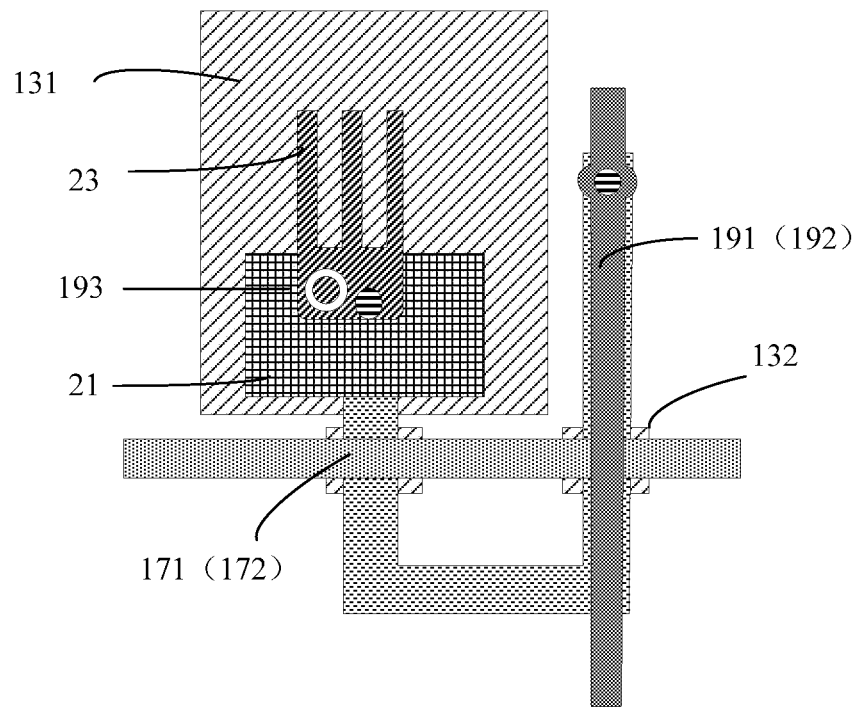
FIG. 6 is a schematic top view of an array substrate according to another embodiment of the present disclosure.

Referring to FIGS. 5 and 6, FIG. 5 is a schematic sectional view of an array substrate according to another embodiment of the present disclosure, and FIG. 6 is a schematic top view of an array substrate according to another embodiment of the present disclosure. As shown in FIGS. 5 and 6, the array substrate includes a base substrate 11, a metal film layer pattern, a buffer layer 14, an active layer 15, a gate insulating layer 16, a gate metal layer, an interlayer dielectric layer 18, a source/drain metal layer, a planarization layer 20, a common electrode layer 21, a passivation layer 22, and a pixel electrode layer 23. The gate metal layer includes a gate line 171 and a gate electrode 172, and the source/drain metal layer includes a data line 191, a source electrode 192, and a drain electrode 193. The active layer 15, the gate electrode 172, the source electrode 192 and the drain electrode 193 and the like constitute a thin film transistor. The metal film layer pattern includes a diffuse reflection layer 131 and a light shielding layer 132, in which the light shielding layer 132 shelters a channel region of the thin film transistor (i.e., a region where the gate electrode 172 overlaps the active layer 15). The diffuse reflection layer 131 and the light shielding layer 132 are arranged on a same layer and made of a same material, and may be formed through one patterning process, thereby reducing the number of masks used and the manufacturing cost.

In the embodiment of the present disclosure, the active layer 15 may be a low temperature polysilicon (LTPS) active layer.

In the array substrate according to the embodiment of the present disclosure, on the basis of using backlight, the diffuse reflection layer may achieve the supply of light by reflecting external light, thus improve the brightness of the display device having the array substrate, and improve the display effect in the external environment.

Figure 7:
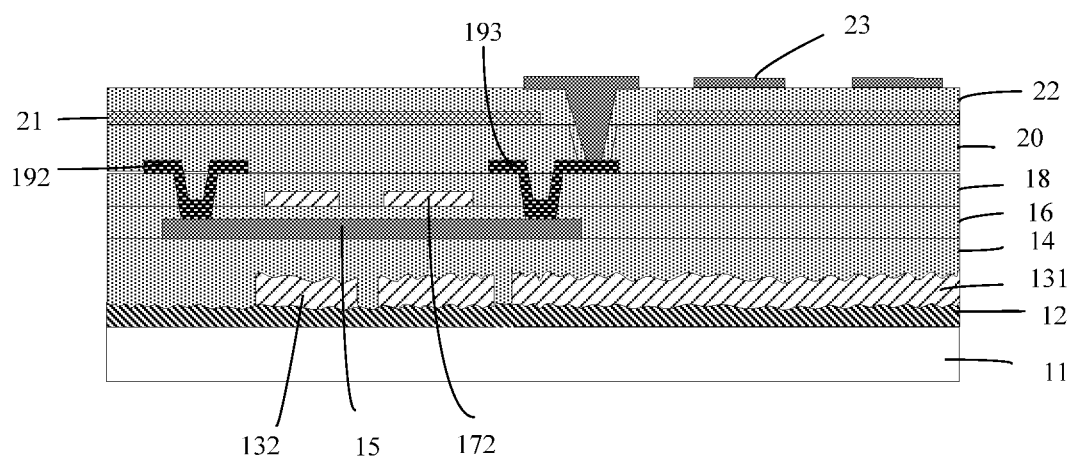
FIG. 7 is a schematic sectional view of an array substrate according to another embodiment of the present disclosure.

Please refer to FIG. 7. FIG. 7 is a schematic sectional view of an array substrate according to another embodiment of the present disclosure. The array substrate differs from the array substrate shown in FIG. 5 in that it further includes an insulating layer 12 arranged on a side of the metal film layer pattern proximate to the base substrate, in which a surface of the insulating layer 12 facing a side of the metal film layer pattern is uneven, so that the formed metal film layer pattern thereon has an uneven surface.

The embodiment of the invention further provides a display device which includes the array substrate as described in any of the above embodiments. The display device may be a display panel including an array substrate, or may be a display device including a display panel and a driving circuit.

Based on a same inventive concept, the embodiment of the present disclosure further provides a method for manufacturing an array substrate according to any of the above embodiments, the method includes a step of forming the diffuse reflection layer in the plurality of pixel regions, in which the surface of the diffuse reflection layer facing the light emitting side of the array substrate is uneven.

The array substrate formed by the above method includes the diffuse reflection layer having the uneven surface arranged in the pixel region, thus it is capable of diffusely reflecting external light, and thus capable of improving the brightness of the display device having the array substrate in an outdoor environment, and improving the display effect in the outdoor environment. Further, since the brightness of the display device is increased by the external light, the energy consumption of the display device is not increased.

The diffuse reflection layer in the manufacturing method in the embodiments of the present disclosure may be made of a metal material having a high reflection coefficient. For example, the material of the diffuse reflection layer may include at least one of Ag, Au, Mo, Al, and Cu, but the diffuse reflection layer may also be made of other materials.

The array substrate in the manufacturing method in the embodiments of the present disclosure may be an array substrate for a liquid crystal display device or an array substrate for an organic light emitting diode display device.

When the array substrate in the manufacturing method in the embodiment of the present disclosure is an array substrate for a liquid crystal display device, since the backlight needs to pass through the pixel region, an orthogonal projection of the diffuse reflection layer onto the base substrate is arranged in a manner of partially overlapping an orthogonal projection of a corresponding one of the plurality of pixel regions onto the base substrate. That is, in the pixel region, the diffuse reflection layer may only occupy a partial region of the corresponding pixel region, and may not occupy the entire region of the corresponding pixel region, so that the backlight may pass through.

When the array substrate in the manufacturing method in the embodiment of the present disclosure is an array substrate for an OLED device, since the backlight does not need to pass through the pixel region, an orthogonal projection of the diffuse reflection layer onto the base substrate may completely overlap an orthogonal projection of a corresponding one of the plurality of pixel regions onto the base substrate. That is, the diffuse reflection layer may occupy the entire region of the corresponding pixel region. Of course, the diffuse reflection layer may also only occupy a partial region of the corresponding pixel region.

When the array substrate in the manufacturing method in the embodiment of the present disclosure is configured for an array substrate of a liquid crystal display device, in order to prevent the channel region of the thin film transistor on the array substrate from being illuminated by the backlight and prevent the performance of the thin film transistor from being adversely affected, generally a light shielding layer for sheltering the thin film transistor from backlight needs to be arranged between the thin film transistor and the base substrate of the array substrate. In the embodiment of the present disclosure, for example, the diffuse reflection layer and the light shielding layer may be formed through one patterning process, thereby reducing the number of masks used and the manufacturing cost. At the same time, the thickness of the array substrate may also be reduced.

In some embodiments of the present disclosure, the step of forming the diffuse reflection layer in the plurality of pixel regions may include the following steps 101 to 106.

Step 101: forming a metal film layer.

In one example, the metal film layer may be formed through a deposition (Dep) process.

Step 102: forming a photoresist layer on the metal film layer.

Step 103: exposing and developing the photoresist layer by using a mask, to form a photoresist layer pattern, in which the photoresist layer pattern includes at least a first pattern region corresponding to a region where the diffuse reflection layer is arranged.

When the array substrate in the embodiment of the present disclosure is an array substrate for a liquid crystal display device and a light shielding layer and the diffuse reflection layer of the array substrate are to be formed through one patterning process, the photoresist layer pattern further includes a second pattern region corresponding to a region where the light shielding layer for sheltering a thin film transistor of the array substrate from backlight is arranged.

That is to say, the mask in the embodiment of the present disclosure includes a pattern corresponding to the diffuse reflection layer in addition to the pattern corresponding to the light shielding layer, as compared with a mask for making a light shielding layer in the related art.

Step 104: removing the metal film layer not covered by the photoresist layer pattern, to form a metal film layer pattern.

In one example, the metal film layer not covered by the photoresist layer pattern may be etched by a wet etch process. When the metal film layer is made of Ag, the metal Ag may be etched by using an etching solution containing nitric acid and phosphoric acid.

Step 105: bombarding the photoresist layer pattern through a plasma descum process to ash the photoresist layer pattern, and continuing to bombard the metal film layer pattern so as to provide the metal film layer pattern with an uneven surface, in which the metal film layer pattern includes a pattern of the diffuse reflection layer.

When the array substrate in the embodiment of the present disclosure is an array substrate for a liquid crystal display device and the light shielding layer and the diffuse reflection layer of the array substrate are to be formed through one patterning process, the metal film layer pattern may further include a pattern of the light shielding layer.

In one example, in the descum process, the photoresist layer pattern may be bombarded with an inert gas (e.g., He/Ar) until the photoresist layer pattern is substantially ashed, and continuously, the metal film layer pattern is bombard so as to provide the metal film layer pattern with the uneven surface.

Step 106: optionally, stripping off the remaining photoresist layer.

In order to avoid a residual photoresist during the bombardment, it is finally necessary to perform a stripping process on the photoresist layer.

In some other embodiments of the present disclosure, the step of forming the diffuse reflection layer in the plurality of pixel regions may include the following steps 101' to 106'.

Step 101': forming a metal film layer.

In one example, the metal film layer may be formed through a deposition process.

Step 102': physically bombarding the metal film layer through a plasma process, to form a metal film layer having an uneven surface.

In one example, in the plasma process, the metal film layer pattern may be bombarded with an inert gas (e.g., He/Ar) so as to provide the metal film layer pattern with the uneven surface.

Step 103': forming a photoresist layer on the metal film layer having the uneven surface.

Step 104': exposing and developing the photoresist layer by using a mask, to form a photoresist layer pattern, in which the photoresist layer pattern includes at least a first pattern region corresponding to a region where the diffuse reflection layer is arranged.

When the array substrate in the embodiment of the present disclosure is an array substrate for a liquid crystal display device and a light shielding layer and the diffuse reflection layer of the array substrate are to be formed through one patterning process, the photoresist layer pattern may further include a second pattern region corresponding to a region where the light shielding layer for sheltering a thin film transistor of the array substrate from backlight is arranged.

That is to say, the mask in the embodiment of the present disclosure includes a pattern corresponding to the diffuse reflection layer in addition to the pattern corresponding to the light shielding layer, as compared with a mask for making a light shielding layer in the related art.

Step 105': removing the metal film layer not covered by the photoresist layer pattern, to form a metal film layer pattern, in which the metal film layer pattern includes a pattern of the diffuse reflection layer.

When the array substrate in the embodiment of the present disclosure is an array substrate for a liquid crystal display device and the light shielding layer and the diffuse reflection layer of the array substrate are to be formed through one patterning process, the metal film layer pattern may further include a pattern of the light shielding layer.

In one example, the metal film layer not covered by the photoresist layer pattern may be etched by a wet etch process. When the metal film layer is made of Ag, the metal Ag may be etched by using an etching solution containing nitric acid and phosphoric acid.

Step 106': optionally, stripping off the remaining photoresist layer.

In order to avoid a residual photoresist during the bombardment, it is finally necessary to perform a stripping process on the photoresist layer.

In some other embodiments of the present disclosure, the step of forming the diffuse reflection layer in the plurality of pixel regions may include the following steps 101" to 106".

Step 101": forming a metal film layer.

In one example, the metal film layer may be formed through a deposition process.

Step 102": forming a photoresist layer on the metal film layer.

Step 103": exposing and developing the photoresist layer by using a mask, to form a photoresist layer pattern, in which the photoresist layer pattern includes at least a first pattern region corresponding to a region where the diffuse reflection layer is arranged.

When the array substrate in the embodiment of the present disclosure is an array substrate for a liquid crystal display device and a light shielding layer and the diffuse reflection layer of the array substrate are to be formed through one patterning process, the photoresist layer pattern further includes a second pattern region corresponding to a region where the light shielding layer for sheltering a thin film transistor of the array substrate from backlight is arranged.

That is to say, the mask in the embodiment of the present disclosure includes a pattern corresponding to the diffuse reflection layer in addition to the pattern corresponding to the light shielding layer, as compared with a mask for making a light shielding layer in the related art.

Step 104": removing the metal film layer not covered by the photoresist layer pattern, to form a metal film layer pattern.

In one example, the metal film layer not covered by the photoresist layer pattern may be etched by a wet etch process. When the metal film layer is made of Ag, the metal Ag may be etched by using an etching solution containing nitric acid and phosphoric acid.

Step 105": stripping off the remaining photoresist layer.

Step 106": bombarding the metal film layer pattern through a plasma process, such that a surface of the metal film layer pattern is uneven, in which the metal film layer pattern includes a pattern of the diffuse reflection layer.

When the array substrate in the embodiment of the present disclosure is an array substrate for a liquid crystal display device and the light shielding layer and the diffuse reflection layer of the array substrate are to be formed through one patterning process, the metal film layer pattern may further include a pattern of the light shielding layer.

In one example, in the plasma process, the photoresist layer pattern may be bombarded with an inert gas (e.g., He/Ar) until the photoresist layer pattern is substantially ashed, and continuously, the metal film layer pattern is bombard so as to provide the metal film layer pattern with the uneven surface.

In some other embodiments of the present disclosure, the step of forming the diffuse reflection layer in the plurality of pixel regions may include the following steps 101''' to 106'''.

Step 101''': forming a metal film layer.

In one example, the metal film layer may be formed through a deposition process.

Step 102''': forming a first photoresist layer on the metal film layer.

Step 103''': bombarding the first photoresist layer through a plasma process to ash the first photoresist layer, and continuing to bombard the metal film layer so as to provide the metal film layer pattern with a uneven surface.

In one example, in the plasma process, the first photoresist layer may be bombarded with an inert gas (e.g., He/Ar) until the photoresist layer pattern is substantially ashed, and continuously, the metal film layer is bombard so as to provide the metal film layer pattern with the uneven surface.

Step 104''': forming a second photoresist layer on the metal film layer having the uneven surface.

Step 105''': exposing and developing the second photoresist layer by using a mask, to form a photoresist layer pattern, in which the photoresist layer pattern includes at least a first pattern region corresponding to a region where the diffuse reflection layer is arranged.

When the array substrate in the embodiment of the present disclosure is an array substrate for a liquid crystal display device and a light shielding layer and the diffuse reflection layer of the array substrate are to be formed through one patterning process, the photoresist layer pattern further includes a second pattern region corresponding to a region where the light shielding layer for sheltering a thin film transistor of the array substrate from backlight is arranged.

That is to say, the mask in the embodiment of the present disclosure includes a pattern corresponding to the diffuse reflection layer in addition to the pattern corresponding to the light shielding layer, as compared with a mask for making a light shielding layer in the related art.

Step 106''': removing the metal film layer not covered by the photoresist layer pattern, to form a metal film layer pattern, in which the metal film layer pattern includes a pattern of the diffuse reflection layer.

When the array substrate in the embodiment of the present disclosure is an array substrate for a liquid crystal display device and the light shielding layer and the diffuse reflection layer of the array substrate are to be formed through one patterning process, the metal film layer pattern may further include a pattern of the light shielding layer.

In one example, the metal film layer not covered by the photoresist layer pattern may be etched by a wet etch process. When the metal film layer is made of Ag, the metal Ag may be etched by using an etching solution containing nitric acid and phosphoric acid.

Step 107''': optionally, stripping off the remaining photoresist layer.

In some other embodiments of the present disclosure, the method for manufacturing the array substrate includes the following steps 201 to 202, and the subsequent step of forming the diffuse reflection layer in the plurality of pixel regions as follows.

Step 201: forming a metal film layer.

In one example, the insulating layer may be formed through a deposition process; and the insulating layer may be made of a material such as $SiN_x$ or $SiO_x$.

Step 202: physically bombarding the insulating layer through a plasma process, to form an insulating layer having an uneven surface.

In one example, in the plasma process which is a descum process, the insulating layer may be physically bombarded with an inert gas such as He/Ar.

The step of forming the diffuse reflection layer in the plurality of pixel regions may include the following steps 203 to 207.

Step 203: forming a metal film layer.

In one example, the metal film layer may be formed through a deposition process.

Step 204: forming a photoresist layer on the metal film layer.

Step 205: exposing and developing the photoresist layer by using a mask, to form a photoresist layer pattern, in which the photoresist layer pattern includes at least a first pattern region corresponding to a region where the diffuse reflection layer is arranged.

When the array substrate in the embodiment of the present disclosure is an array substrate for a liquid crystal display device and a light shielding layer and the diffuse reflection layer of the array substrate are to be formed through one patterning process, the photoresist layer pattern further includes a second pattern region corresponding to a region where the light shielding layer for sheltering a thin film transistor of the array substrate from backlight is arranged.

That is to say, the mask in the embodiment of the present disclosure includes a pattern corresponding to the diffuse reflection layer in addition to the pattern corresponding to the light shielding layer, as compared with a mask for making a light shielding layer in the related art.

Step 206: removing the metal film layer not covered by the photoresist layer pattern, to form a metal film layer pattern having an uneven surface, in which the metal film layer pattern includes a pattern of the diffuse reflection layer.

When the array substrate in the embodiment of the present disclosure is an array substrate for a liquid crystal display device and the light shielding layer and the diffuse reflection layer of the array substrate are to be formed through one patterning process, the metal film layer pattern may further include a pattern of the light shielding layer.

In one example, the metal film layer not covered by the photoresist layer pattern may be etched by a wet etch process. When the metal film layer is made of Ag, the metal Ag may be etched by using an etching solution containing nitric acid and phosphoric acid.

Step 207: stripping off the photoresist layer pattern.

In the embodiment of the present disclosure, an insulating layer having an uneven surface is first formed, and then a metal film layer is formed on the insulating layer. Since the thickness of the metal film layer is relatively thin, the metal film layer naturally has an uneven surface corresponding to the insulating layer.

Figure 8:
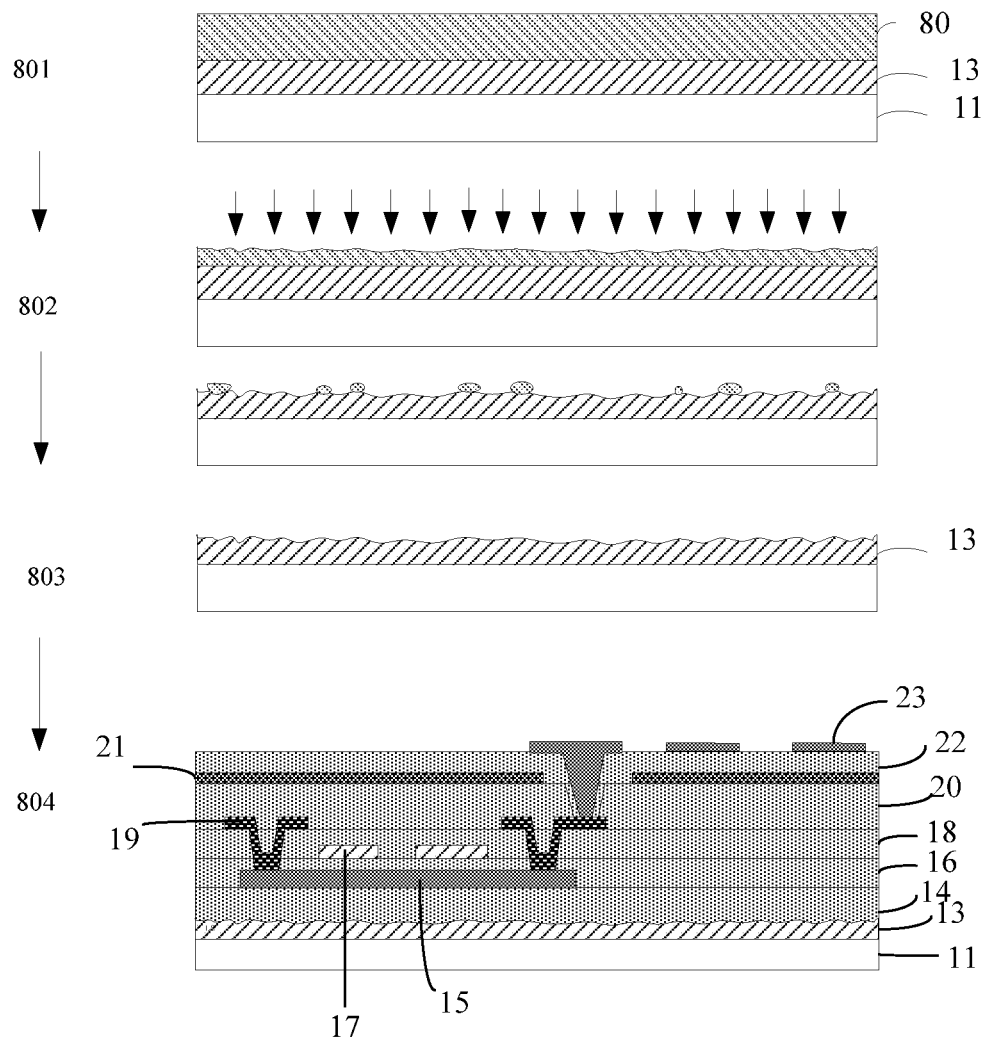
FIG. 8 is a schematic view of a method for manufacturing an array substrate according to another embodiment of the present disclosure.

Referring to FIG. 8, FIG. 8 is a schematic view of a method for manufacturing an array substrate according to another embodiment of the present disclosure, and the method for manufacturing the array substrate may include the following steps 801 to 804.

Step 801: forming a metal film layer and a photoresist layer on the base substrate 11, and exposing and developing the photoresist layer by using a mask, to form a photoresist layer pattern 80, in which the photoresist layer pattern 80 includes a first pattern region corresponding to a region where the diffuse reflection layer is arranged and a second pattern region corresponding to a region where a light shielding layer for sheltering a thin film transistor of the array substrate from backlight is arranged; and removing the metal film layer not covered by the photoresist layer pattern 80, to form a metal film layer pattern 13.

In one example, the metal film layer may be formed through a deposition process; and the metal film layer not covered by the photoresist layer pattern 80 may be etched by a wet etch process. When the metal film layer is made of Ag, the metal Ag may be etched by using an etching solution containing nitric acid and phosphoric acid.

Step 802: bombarding the photoresist layer pattern 80 through a descum process to ash the photoresist layer pattern, and continuing to bombard the metal film layer pattern so as to provide the metal film layer pattern 13 with a uneven surface.

In one example, in the descum process, the photoresist layer pattern 80 may be physically bombarded with an inert gas (e.g., He/Ar) until the photoresist layer pattern is substantially ashed, and continuously, the metal film layer pattern is bombard so as to provide the metal film layer pattern 13 with a uneven surface.

Step 803: stripping off the remaining photoresist layer.

Step 804: sequentially forming a buffer layer 14, an active layer 15, a gate insulating layer 16, a gate metal layer 17 including a gate electrode, an interlayer dielectric layer 18, a source/drain metal layer 19 including source and drain electrodes, a planarization layer 20, a common electrode layer 21, a passivation layer 22, and a pixel electrode layer 23.

In the embodiment of the present disclosure, only the metal of the metal film layer and the process flow are adjusted without increasing the number of the masks, and the subsequent process does not need to be changed.

Figure 9:
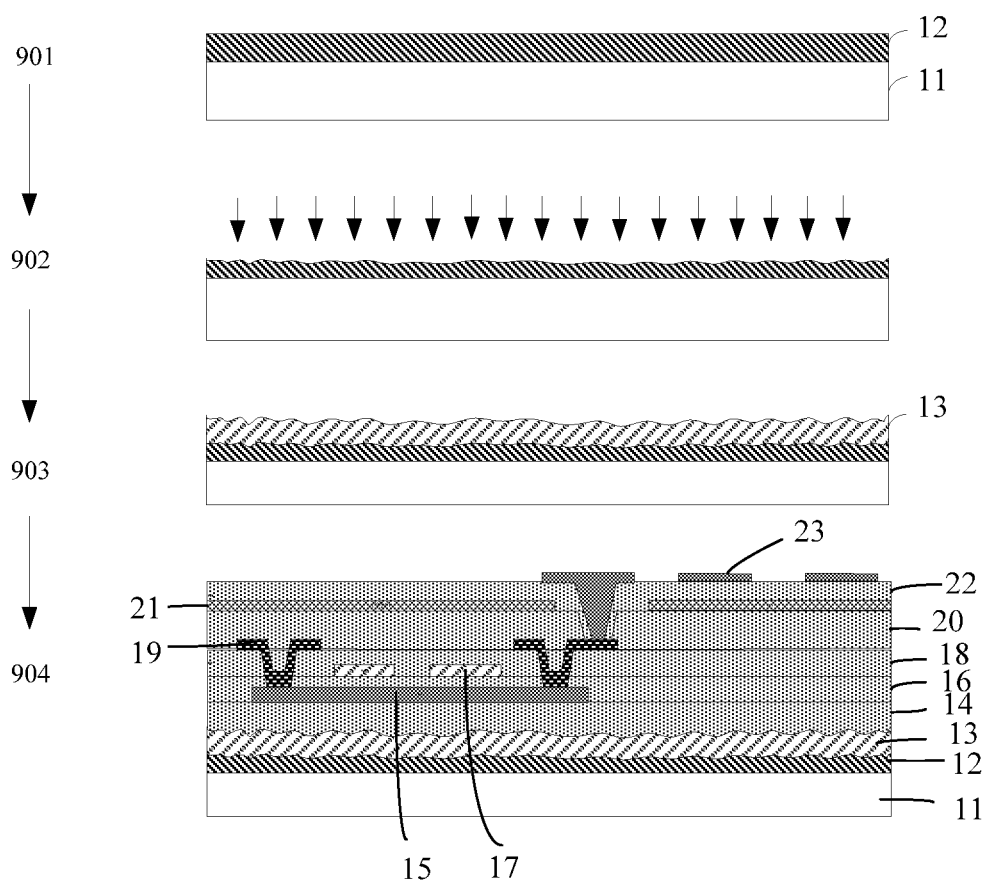
FIG. 9 is a schematic view of a method for manufacturing an array substrate according to another embodiment of the present disclosure.

Referring to FIG. 9, FIG. 9 is a schematic view of a method for manufacturing an array substrate according to another embodiment of the present disclosure, and the method for manufacturing the array substrate may include the following steps 901 to 904.

Step 901: forming an insulating layer 12 on the base substrate 11.

Step 902: physically bombarding the insulating layer 12 through a plasma process, to form an insulating layer 12 having an uneven surface.

Step 903: forming a metal film layer pattern 13 on the insulating layer 12 having the uneven surface, in which the metal film layer pattern 13 includes a pattern of a diffuse reflection layer and a pattern of a light shielding layer, in which a surface of the metal film layer pattern 13 is uneven.

Step 904: forming a buffer layer 14, an active layer 15, a gate insulating layer 16, a gate metal layer 17 including a gate electrode, an interlayer dielectric layer 18, a source/drain metal layer 19 including source and drain electrodes, a planarization layer 20, a common electrode layer 21, a passivation layer 22, and a pixel electrode layer 23.

In the embodiment of the present disclosure, only the metal of the metal film layer and the process flow are adjusted without increasing the number of the masks, and the subsequent process does not need to be changed.

Unless otherwise defined, technical terms or scientific terms used herein have the normal meaning commonly understood by one skilled in the art in the field of the present disclosure. The words "first", "second", and the like used in the present disclosure do not denote any order, quantity, or importance, but rather merely serves to distinguish different components. Similarly, the words "one", "a/an" and the like do not denote any quantitative limitation, but rather denote at least one. The word "connected" or "connecting" and the like are not limited to physical or mechanical connections, but may also include electrical connections, whether direct or indirect. "On", "under", "left", "right" and the like are only used to represent relative positional relationships, and when the absolute position of the described object is changed, the relative positional relationship may also be changed, accordingly.

The above descriptions relate to preferred embodiments of the present disclosure. It should be noted that one skilled in the art would make several improvements and substitutions without departing from the principles of the present disclosure. These improvements and modifications should also be regarded as falling into the protection scope of the present disclosure.

What is claimed is:

1. An array substrate, comprising a base substrate, a buffer layer, an active layer, a gate insulating layer, a gate metal layer, an interlayer dielectric layer, a source/drain metal layer, gate lines and data lines arranged on the base substrate to define a plurality of pixel regions, and a diffuse reflection layer arranged in the plurality of pixel regions and in direct contact with the base substrate,
wherein a surface of the diffuse reflection layer facing a light emitting side of the array substrate is uneven, and the diffuse reflection layer is made entirely of one material,
wherein in each of the plurality of pixel regions, the diffuse reflection layer is arranged in an entire pixel region other than a region where a channel of the active layer locates, and
wherein a gap for passing through backlight incident from the base substrate exists between the diffuse reflection layer and the gate line and between the diffuse reflection layer and the data line, or the diffuse reflection layer has a gap for passing through backlight incident from the base substrate.

2. The array substrate of claim 1, further comprising a light shielding layer for sheltering a thin film transistor of the array substrate from backlight.

3. The array substrate of claim 2, wherein the diffuse reflection layer and the light shielding layer are arranged on a same layer and made of a same material.

4. The array substrate of claim 1, wherein an orthogonal projection of the diffuse reflection layer onto the base substrate at least partially overlaps an orthogonal projection of a corresponding one of the plurality of pixel regions onto the base substrate.

5. The array substrate of claim 4, wherein the array substrate is an array substrate of a liquid crystal display device.

6. The array substrate of claim 1, further comprising an insulating layer arranged on the base substrate, wherein the insulating layer is arranged on a side of the diffuse reflection layer proximate to the base substrate, and a surface of the insulating layer facing a side of the diffuse reflection layer is uneven.

7. The array substrate of claim 1, wherein a material of the diffuse reflection layer comprises at least one of Ag, Au, Mo, Al, and Cu.

8. The array substrate of claim 1, wherein the diffuse reflection layer comprises at least one of a plate-type structure, a strip-type structure, and a block-type structure comprising blocks arranged in a matrix form.

9. A display device, comprising the array substrate of claim 1.

10. The display device of claim 9, wherein the array substrate further comprises a light shielding layer for sheltering a thin film transistor of the array substrate from backlight, and the diffuse reflection layer and the light shielding layer are arranged on a same layer and made of a same material.

11. The display device of claim 9, wherein the array substrate further comprises an insulating layer arranged on the base substrate, the insulating layer is arranged on a side of the diffuse reflection layer proximate to the base substrate, and a surface of the insulating layer facing a side of the diffuse reflection layer is uneven.

12. A method for manufacturing an array substrate, wherein the array substrate comprises a base substrate, a buffer layer, an active layer, a gate insulating layer, a gate metal layer, an interlayer dielectric layer, a source/drain metal layer, gate lines and data lines arranged on the base substrate to define a plurality of pixel regions, and a diffuse reflection layer arranged in the plurality of pixel regions and in direct contact with the base substrate, wherein a surface of the diffuse reflection layer facing a light emitting side of the array substrate is uneven, and the diffuse reflection layer is made entirely of one material,
the method comprising:
forming the diffuse reflection layer in the plurality of pixel regions, wherein the surface of the diffuse reflection layer facing the light emitting side of the array substrate is uneven; and
sequentially forming the buffer layer, the active layer, the gate insulating layer, the gate metal layer, the interlayer dielectric layer and the source/drain metal layer,
wherein the forming the diffuse reflection layer in the plurality of pixel regions comprises:
forming a metal film layer;
forming a photoresist layer on the metal film layer;
exposing and developing the photoresist layer, to form a photoresist layer pattern, wherein the photoresist layer pattern comprises at least a first pattern region corresponding to a region where the diffuse reflection layer is arranged;
removing the metal film layer not covered by the photoresist layer pattern, to form a metal film layer pattern;
bombarding the photoresist layer pattern through a plasma process to ash the photoresist layer pattern, and continuing to bombard the metal film layer pattern so as to provide the metal film layer pattern with an uneven surface, wherein the metal film layer pattern comprises a pattern of the diffuse reflection layer; and
stripping off the remaining photoresist layer.

13. The method of claim 12, wherein
prior to forming the diffuse reflection layer in the plurality of pixel regions, the method further comprises:
forming an insulating layer; and
bombarding the insulating layer through a plasma process, to form an insulating layer having an uneven surface,
wherein the forming the diffuse reflection layer in the plurality of pixel regions comprises:
forming a metal film layer;
forming a photoresist layer on the metal film layer;
exposing and developing the photoresist layer, to form a photoresist layer pattern, wherein the photoresist layer pattern comprises at least a first pattern region corresponding to a region where the diffuse reflection layer is arranged;

removing the metal film layer not covered by the photoresist layer pattern, to form a metal film layer pattern having an uneven surface, wherein the metal film layer pattern comprises a pattern of the diffuse reflection layer; and stripping off the remaining photoresist layer.

14. The method of claim 13, wherein the plasma process is a plasma descum process.

15. The method of claim 13, wherein the photoresist layer pattern further comprises a second pattern region corresponding to a region wherein a light shielding layer for sheltering a thin film transistor of the array substrate from backlight is arranged, and the formed metal film layer pattern further comprises a pattern of the light shielding layer.

16. The method of claim 12, wherein the plasma process is a plasma descum process.

17. The method of claim 12, wherein the photoresist layer pattern further comprises a second pattern region corresponding to a region wherein a light shielding layer for sheltering a thin film transistor of the array substrate from backlight is arranged, and the formed metal film layer pattern further comprises a pattern of the light shielding layer.

18. The method of claim 12, wherein an orthogonal projection of the diffuse reflection layer onto the base substrate at least partially overlaps an orthogonal projection of a corresponding one of the plurality of pixel regions onto the base substrate.

19. The method of claim 12, wherein a material of the metal diffuse reflection layer comprises at least one of Ag, Au, Mo, Al, and Cu.

20. An array substrate, comprising a base substrate, a buffer layer, an active layer, a gate insulating layer, a gate metal layer, an interlayer dielectric layer, a source/drain metal layer, gate lines and data lines arranged on the base substrate to define a plurality of pixel regions, a diffuse reflection layer arranged in the plurality of pixel regions and in direct contact with the base substrate, and a light shielding layer for sheltering a thin film transistor of the array substrate from backlight and arranged at a position where a channel of the active layer locates, wherein a surface of the diffuse reflection layer facing a light emitting side of the array substrate is uneven, and the diffuse reflection layer is made entirely of one material, wherein in each of the plurality of pixel regions, the diffuse reflection layer is arranged in an entire pixel region other than a region where a channel of the active layer locates, and wherein a gap for passing through backlight incident from the base substrate exists between the diffuse reflection layer and the gate line and between the diffuse reflection layer and the data line, or the diffuse reflection layer has a gap for passing through backlight incident from the base substrate.

* * * * *